(12) United States Patent
Cressman

(10) Patent No.: US 8,289,048 B2
(45) Date of Patent: Oct. 16, 2012

(54) STATE TRANSITIONING CLOCK GATING

(75) Inventor: John W. Cressman, Jefferson, MA (US)

(73) Assignee: Intel Corporation, Santa Clara, CA (US)

( * ) Notice: Subject to any disclaimer, the term of this patent is extended or adjusted under 35 U.S.C. 154(b) by 146 days.

(21) Appl. No.: 12/769,374

(22) Filed: Apr. 28, 2010

(65) Prior Publication Data

US 2011/0271128 A1 Nov. 3, 2011

(51) Int. Cl.
*G06F 7/38* (2006.01)
*H03K 19/173* (2006.01)
*H03K 19/00* (2006.01)
*H03K 19/096* (2006.01)
*H03K 3/356* (2006.01)

(52) U.S. Cl. ............. 326/46; 326/93; 327/212; 712/232

(58) Field of Classification Search .................... 326/46, 326/93, 95; 327/201–218, 224, 225; 712/232
See application file for complete search history.

(56) References Cited

U.S. PATENT DOCUMENTS

| | | | | |
|---|---|---|---|---|
| 5,498,988 A * | 3/1996 | Reyes et al. | .................... | 327/199 |
| 5,799,048 A * | 8/1998 | Farjad-Rad et al. | .......... | 375/360 |
| 5,989,695 A * | 11/1999 | Fuller et al. | .................... | 428/221 |
| 6,630,853 B1 * | 10/2003 | Hamada | ........................ | 327/202 |
| 6,879,185 B2 * | 4/2005 | Swami et al. | .................... | 326/93 |
| 7,023,240 B2 * | 4/2006 | Elappuparackal | .............. | 326/40 |
| 7,420,391 B2 * | 9/2008 | Pesci | ............................... | 326/46 |
| 7,576,582 B2 * | 8/2009 | Lee et al. | ....................... | 327/202 |
| 2004/0246810 A1* | 12/2004 | Dike et al. | ..................... | 365/233 |
| 2010/0316387 A1* | 12/2010 | Suvakovic | ...................... | 398/98 |

* cited by examiner

*Primary Examiner* — Shawki S Ismail
*Assistant Examiner* — Dylan White
(74) *Attorney, Agent, or Firm* — Blakely, Sokoloff, Taylor & Zafman LLP

(57) ABSTRACT

In some embodiments, new clock gating approaches, referred hereafter as State Transition Gating (STG) methods and circuits are provided. In areas of circuit designs including sequential elements, the use of STG may be used to reduce dynamic power consumption.

15 Claims, 3 Drawing Sheets

STATE TRANSITIONING CLOCK GATING

TECHNICAL FIELD

Some embodiments relate generally to clock gating and in particular, to methods and circuits directed to clock gating based on state transitioning.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

In some embodiments, new clock gating approaches, referred hereafter as State Transition Gating (STG) methods and circuits are provided. In areas of circuit designs including sequential elements with increased clock loading, the use of STG may be used to reduce dynamic power consumption. With clock distribution networks, increased loading generally results in a higher overall switching capacitance and thus, increased dynamic power is required for driving it. Using STG to minimize the clock network activity in these areas has the potential to generate power savings.

Among other things, STG can allow clock signals for groups (or clusters) of sequential elements to be dynamically gated, in real-time, when their associated data to be clocked is not going to change (their output is not going to transition). This can reduce the dynamic power dissipated within functional unit blocks containing the STG circuitry. In some embodiments, the local clock networks, utilized by groups of sequential elements, are disabled based on a determination that the data to be stored in a given clock cycle does not differ from the previous cycle. Thus, power reduction is attained, over time, by dynamically shutting off, and turning back on, portions of local clock distribution networks during cycles when next state data for groups of sequential elements is the same as the currently stored state for each member of the group.

STG solutions may be contrasted with conventional solutions, which generally implement functional gating (FG, whereby clocks for whole blocks or domains are gated off, e.g., when a domain is changed to a less active state. That is, with functional gating, all circuitry corresponding to the particular function being gated is enabled or disabled together, depending on if the functionality is needed by an application during that time. With the use of STG, however, finer granularity in power management can be attained, allowing multiple sub groups of the functionality to be disabled even when the overall function is enabled within the FG context. The STG system can continuously check for unchanged data and enable the local clock network, on demand, to individual groups of sequential elements.

Figure 1:
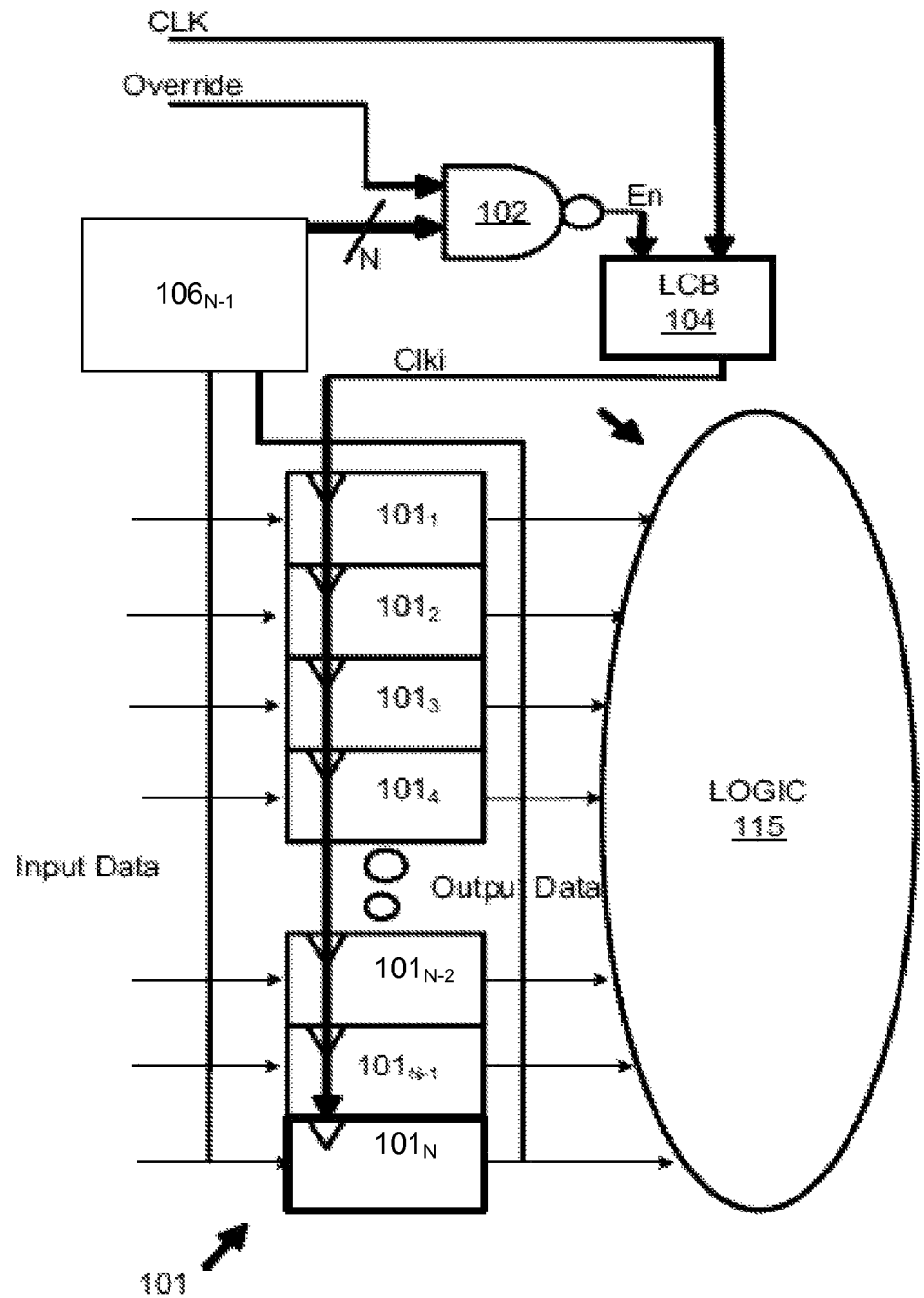
FIG. 1 is a schematic diagram of a logic circuit with state transition gating in accordance with some embodiments.

FIG. 1 shows an STG implementation, in accordance with some embodiments, for gating a cluster 101 of sequential circuits 101 such as master/slave flip-flop circuits, latches, or the like. The sequential circuits $101_i$ may correspond to any sequential circuit for clocking input data into output data to logic 115 using a common clock signal such as CLKi. Logic 115 may correspond to any circuitry such as registers, combinational logic, pipeline elements, memory cells, etc.

The STG circuitry for servicing the depicted sequential cluster comprises a gate (NAND) 102, local clock buffer (LCB) 104, and multiple 'N$_1$', (one for each sequential $101_i$) XNOR gates 106, all coupled together as shown. An XNOR gate is associated with each sequential to generate an output that is the logical "XNOR" result of the input and output for its associated sequential. The XNOR outputs for all of the sequentials in the cluster, along with an override signal, are fed into the multiple input (N+1) NAND gate 102. The output of the NAND gate provides an enable (EN) that controls whether or not the local clock buffer 104 is enabled to clock each sequential with a clock signal (Clki) generated from a clock signal (Clk) provided to the LCB driver 104.

In operation, if the input and output data for each sequential are the same, indicating that the sequential is not going to transition its output data value, then the Clki is disengaged by the LCB 104. On the other hand, if an input/output data pair from one or more sequentials are different, then the Clki is enabled, and the entire cluster of sequentials are clocked, at least for that cycle.

The override signal can activate the LCB to enable the sequential clocks (Clki) regardless of the data values at their input/output pairs. It may be useful, for example, if a manufactured chip has timing characteristics that are too tight for reliable operation.

The cluster in the depicted embodiment may comprise 10-20 sequential elements, but any number could be used. The single clock driver (LCB 104) distributes the local clock to these elements.

The areas of circuitry which may have the highest benefit from using STG will typically be those with free running clocks and without a significant number of logic stages between sequential elements. Due to the additional logic introduced with STG, areas of a design with reasonable timing margin are preferred. In addition, design areas which include clock networks with higher capacitive loading and therefore larger clock drivers have the potential to benefit the most from this system.

An example of a suitable application is clusters using radiation hardened sequential elements for the purpose of increased reliability. In these portions of a design, the total power is typically dominated by the clock distribution network because of the increased amount of clock loading associated with each radiation hardened device. A few additional factors may be considered in the process of selecting applications for utilizing STG. These factors include leakage power, cell utilization and routing congestion. Moreover, designs which allow for the use of low leakage devices and are dominated by dynamic power may make better candidates than designs which do not.

Utilizing low leakage devices reduces the additional leakage power incurred by the new logic associated with the STG system. In blocks where less dynamic power is generally dissipated than leakage power, STG may not return a sufficient benefit. In these cases the additional leakage power incurred may actually exceed the dynamic power saved. The additional logic also may increase the overall utilization of the block, and therefore blocks with a high utilization or significant routing congestion may also benefit less. The same may be true for a read pipeline as well as a number of other variations. STG can also be applied to numerous groupings of circuitry within synthesized blocks where many different sets of functionality are combined into a single block. Thus, as with almost any design, considerations weighing the benefits against the costs for implementing STG will likely be made on a design by design basis.

Figure 2:
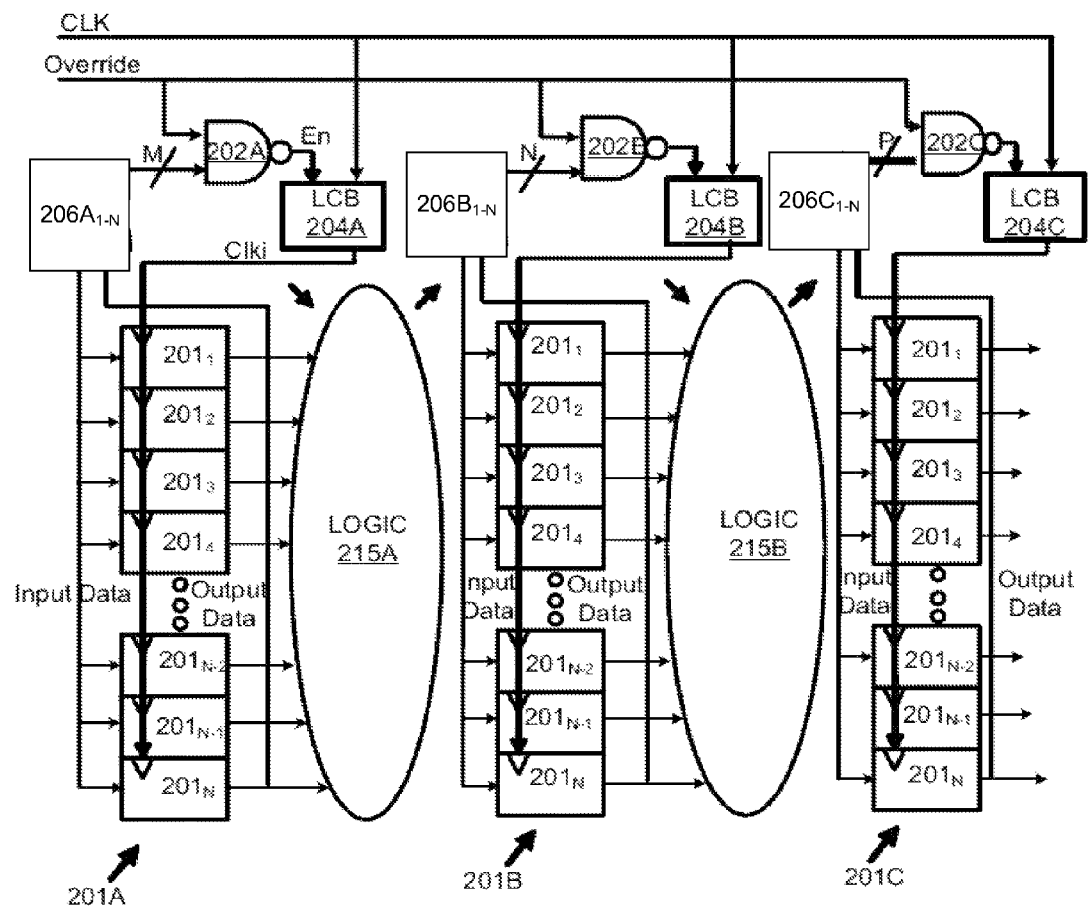
FIG. 2 is a schematic diagram of multiple logic circuits with state transition clock gating circuits linked together in accordance with some embodiments.

With reference to FIG. 2, a portion of an STG system comprising clusters 201A-C is shown. Each cluster has its own set of XNOR gates 206 (A-C), NAND gates 202 (A-C), and LCB buffers 204 (A-C), but the NAND gates and LCB buffers are driven by the same clock (Clk) and override signal. The clusters are cascaded together, as shown, with the outputs from a preceding logic block 215 (A-B) providing the inputs for the subsequent cluster. Again, it can be seen that STG enables and disables clocks on demand, separately for each cluster 201, resulting in minimal dynamic power dissipation during periods of low activity local to these elements.

The clusters may correspond to any suitable application. For example, some or all of the logic 215 could make up one or more register banks, e.g., with pipelined write data. With an STG implementation, portions of the clock network, even during stretches of cycles when write operations are being executed and data is traversing the pipeline, can be disengaged to save significant power over time. As another example, consider when the clusters are part of a memory array, which is being written constantly with values that are small, and therefore only the least significant bits are changing in a 32 or 64 bit data value. conventional functional gating would require all the sequential elements staging this data to be enabled as long as the stage contains any relevant data at all. On the other hand, the STG system recognizes that the upper order bits continuously need to store 0's and therefore can stop the local clock network to that group of sequential elements for all but the first cycle. In turn, this can greatly reduce the amount of clock network toggling in such memory applications.

The override signal is distributed to each cluster of the STG system. In the depicted embodiment, it is set high to enable the system and set low to disable it. There typically may be one override control bit used among multiple sequential element clusters within a single functional block. As discussed above, for example, it may be used to allow for the system to be disabled in blocks where an unexpected speed path is identified, post silicon for example. Another possible use is during applications when the design is put into a low power mode, e.g., where the operating frequency is lowered. On the other hand, when the frequency is lowered, STG might be enabled when it otherwise may have not been, for example, if it was not possible to enable it at higher frequencies due to critical timing paths.

Figure 3:
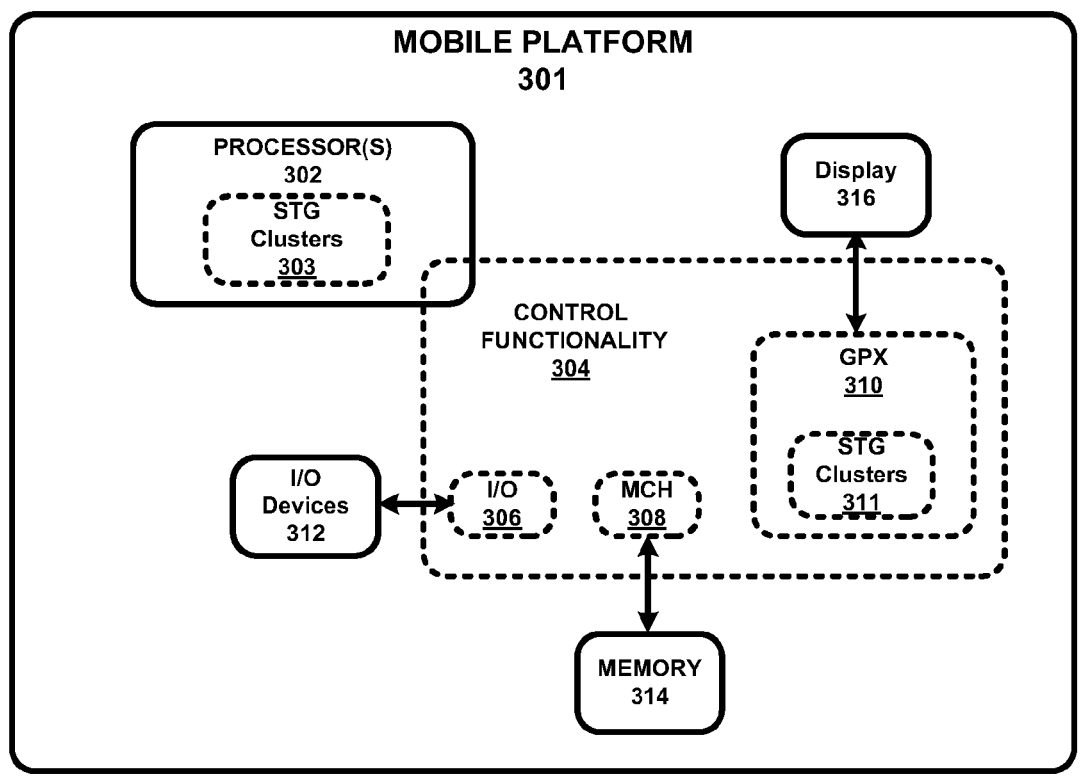
FIG. 3 is a block diagram of a mobile computing platform with one or more state transition clock gating circuits in accordance with some embodiments.

With reference to FIG. 3, one example of a portion of a mobile platform 301 is shown. The represented portion comprises one or more processors/processor cores 302, control functionality 304, with I/O hub functionality 306, memory control hub functionality 308, a graphics processing unit (GPX) 310, I/O devices 312, memory 314, and a display 316, coupled together as shown.

The control functionality 304 may comprise one or more circuit blocks to perform various interface control functions (e.g., memory control (MCH 308), graphics processing 310, I/O interface control 306, and the like. These circuits may be implemented on one or more separate chips and/or may be partially or wholly implemented as part of the processor chip 302, e.g., as may be the case with a system-on-chip (SOC) implementation. On the other hand, the separate control units, such as the GPX 310, could be part of a wholly separate chip or module.

The I/O devices 312 comprise one or more devices including but not limited to scanners, printers, cameras, bus interface ports, keyboards, flash drives, mousse, joysticks, etc. The I/O devices may be directly coupled to the I/O controller 306, or indirectly through one or more different busses such as through a PCI bus or the like. The I/O controller 306 may comprise multiple different interface control units, encompassing control units such as wireless interfaces, network interfaces, etc. The memory 314 may comprise any suitable memory including but not limited to random access memory (RAM), non-volatile memory such as solid-state hard drives, flash drives, etc. While the memory block is shown coupled to the MCH functionality, it may also, or instead of, be coupled through the I/O control functionality 306. The display may constitute one or more displays, such as an LCD display, for providing visual information to a user.

The processor, in its one or more cores, comprises STG clusters 303 of sequentials providing data to registers, memory arrays, and/or other units using sequentials. Similarly, the GPX 310 may also comprise one or more STG clusters 311 of sequentials. Even though not depicted, STG clusters could alternatively or additionally be implemented in memory 314 and/or in other parts of the control functionality.

The mobile platform 301 may implement a variety of different computing devices or other appliances with computing capability. Such devices include but are not limited to laptop computers, notebook computers, personal digital assistant devices (PDAs), cellular phones, audio and/or or video media players, and the like. It could constitute one or more complete computing systems or alternatively, it could constitute one or more components useful within a computing system.

In the preceding description, numerous specific details have been set forth. However, it is understood that embodiments of the invention may be practiced without these specific details. In other instances, well-known circuits, structures and techniques may have not been shown in detail in order not to obscure an understanding of the description. With this in mind, references to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the preceding description and following claims, the following terms should be construed as follows: The terms "coupled" and "connected," along with their derivatives, may be used. It should be understood that these terms are not intended as synonyms for each other. Rather, in particular embodiments, "connected" is used to indicate that two or more elements are in direct physical or electrical contact with each other. "Coupled" is used to indicate that two or more elements co-operate or interact with each other, but they may or may not be in direct physical or electrical contact.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chip set components, programmable logic arrays (PLA), memory chips, network chips, and the like.

It should also be appreciated that in some of the drawings, signal conductor lines are represented with lines. Some may be thicker, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

It should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the FIGS, for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. A method comprising:
for a cluster of sequential elements, determining if a state change will occur in any of the sequential elements;
gating off a clock for the cluster if a state change will not occur in any of the sequential elements; and
enabling the clock even if no transition will occur if an override signal is asserted.

2. The method of claim 1, wherein the cluster comprises between 10 and 20 sequential elements.

3. The method of claim 1, wherein the sequential elements comprise flip-flop circuits.

4. The method of claim 1, wherein the cluster is part of a plurality of clusters cascaded together.

5. A chip comprising:
a group of sequential elements coupled to a common clock;
a first circuit to determine if a state change is to occur at an output of any of the sequential elements in the group; and
a second circuit to disengage the common clock if no transition is to occur,
wherein the common clock is enabled even if no transition will occur if an override signal is asserted.

6. The chip of claim 5, wherein the first circuit comprises an XNOR gate for each sequential element to compare input and output data of the sequential element to determine if it's output is to transition.

7. The chip of claim 6, wherein the first circuit comprises a gate to determine if any of the XNOR gates indicates that its sequential element will transition.

8. The chip of claim 5, wherein the group comprises 10 to 20 sequential elements.

9. The chip of claim 5, wherein the sequential elements comprise flip-flop circuits.

10. The chip of claim 5, wherein the common clock is a local clock generated from a general clock used for sequential elements other than those in the group.

11. A computing platform comprising:
a memory; and
a processor communicatively coupled to the memory, the processor having one or more cores, each core comprising at least one state transition gated (STG) sequential cluster, the STG cluster having a plurality of sequential elements receiving a clock,
wherein the clock is enabled even if no transition will occur in the plurality of sequential elements if an override signal is asserted.

12. The computing platform of claim 11, comprising a graphics processing unit having at least one STG sequential cluster.

13. The computing platform of claim 11, wherein the processor is part of a system-on-chip.

14. The computing platform of claim 11, wherein the plurality of sequential elements, if an override is not asserted, is disengaged if all of the sequential elements of the plurality of the sequential elements in the cluster will not change state for a next clock cycle.

15. The computing platform of claim 11, wherein the cluster is part of a group of clusters cascaded together.

* * * * *